United States Patent
Sano et al.

(10) Patent No.: US 7,135,754 B2
(45) Date of Patent: Nov. 14, 2006

(54) CHIP TYPE SOLID ELECTROLYTIC CAPACITOR HAVING A SMALL SIZE AND A SIMPLE STRUCTURE

(75) Inventors: Mitsunori Sano, Kurobe (JP); Takashi Kono, Sagamihara (JP); Makoto Tsutsui, Uozu (JP)

(73) Assignees: Nec Tokin Corporation, Sendai (JP); Nec Tokin Toyama, Ltd., Shimonikawa-gun (JP)

( * ) Notice: Subject to any disclaimer, the term of this patent is extended or adjusted under 35 U.S.C. 154(b) by 44 days.

(21) Appl. No.: 10/757,643

(22) Filed: Jan. 13, 2004

(65) Prior Publication Data

US 2004/0145065 A1 Jul. 29, 2004

(30) Foreign Application Priority Data

Jan. 24, 2003 (JP) ............................. 2003-016177

(51) Int. Cl.
 H01L 23/48 (2006.01)
 H05K 7/06 (2006.01)
 H01G 4/228 (2006.01)
 H01G 9/04 (2006.01)
 H09G 9/012 (2006.01)

(52) U.S. Cl. .............................. 257/528; 257/E23.044; 257/E23.124; 257/924; 257/787; 257/532; 257/728; 257/696; 257/796; 257/773; 257/783; 257/535; 257/684; 361/535; 361/538; 361/540; 361/508; 361/523; 361/534; 361/315; 29/25.42; 29/25.03; 29/832; 174/52.1

(58) Field of Classification Search ................ 257/528, 257/532, 728, 666, 696, 684, 796, 773, 783, 257/535, E23.044, E23.124; 361/528, 532, 361/529, 534, 433, 310, 535, 538, 540, 315, 361/508, 523
See application file for complete search history.

(56) References Cited

U.S. PATENT DOCUMENTS

| | | | | |
|---|---|---|---|---|
| 4,510,554 A | * | 4/1985 | Irikura ........................ | 361/540 |
| 4,757,423 A | * | 7/1988 | Franklin ................... | 361/275.4 |
| 4,935,848 A | * | 6/1990 | Yamane et al. ............. | 361/534 |
| 5,177,674 A | * | 1/1993 | Sugisaki ..................... | 361/534 |
| 5,216,584 A | * | 6/1993 | Okazaki et al. ............. | 361/534 |
| 5,661,628 A | * | 8/1997 | Yamagami ................ | 361/275.4 |
| 6,042,740 A | * | 3/2000 | Uehara et al. ............. | 252/62.2 |
| 6,236,561 B1 | * | 5/2001 | Ogino et al. ................ | 361/523 |
| 6,262,878 B1 | * | 7/2001 | Shirashige et al. ......... | 361/508 |
| 6,400,556 B1 | | 6/2002 | Masuda et al. | |
| 6,430,034 B1 | * | 8/2002 | Sano et al. .................. | 361/528 |
| 6,467,142 B1 | * | 10/2002 | Shirashige et al. ........ | 29/25.42 |
| 6,574,093 B1 | * | 6/2003 | Kida et al. .................. | 361/516 |

(Continued)

FOREIGN PATENT DOCUMENTS

| | | |
|---|---|---|
| JP | 60-129154 A | 8/1985 |
| JP | 61-50323 A | 3/1986 |
| JP | 61-50325 A | 3/1986 |
| JP | 1-71431 A | 5/1989 |
| JP | 4-68517 A | 6/1992 |

(Continued)

*Primary Examiner*—Alexander Oscar Williams
(74) *Attorney, Agent, or Firm*—Frishauf, Holtz, Goodman & Chick, P.C.

(57) ABSTRACT

In a chip type solid electrolytic capacitor including a capacitor element and a packaging resin covering the capacitor element, the packaging resin has a mount surface and a side surface adjacent to the mount surface. A terminal is electrically connected to the capacitor element and coupled to the packaging resin. The terminal extends along the mount surface and the side surface to have an outer surface exposed from the packaging resin and to have an inner surface opposite to the outer terminal surface. The inner surface has a stepwise shape formed by forging.

9 Claims, 7 Drawing Sheets

U.S. PATENT DOCUMENTS

| | | | |
|---|---|---|---|
| 6,616,713 B1* | 9/2003 | Sano et al. | 29/25.03 |
| 6,811,576 B1* | 11/2004 | Igaki et al. | 29/25.03 |
| 6,819,546 B1* | 11/2004 | Kuriyama | 361/535 |
| 6,903,921 B1* | 6/2005 | Ishijima | 361/523 |
| 6,975,503 B1* | 12/2005 | Abe et al. | 361/533 |
| 2001/0028544 A1* | 10/2001 | Sano et al. | 361/301.3 |
| 2004/0103508 A1* | 6/2004 | Kanetake | 29/25.03 |
| 2004/0125542 A1* | 7/2004 | Fujii et al. | 361/523 |
| 2004/0145065 A1* | 7/2004 | Sano et al. | 257/787 |
| 2004/0157400 A1* | 8/2004 | Melody et al. | 438/396 |
| 2004/0160730 A1* | 8/2004 | Tsutsui et al. | 361/528 |
| 2005/0002148 A1* | 1/2005 | Ishijima | 361/315 |
| 2005/0030678 A1* | 2/2005 | Taketani et al. | 361/15 |
| 2005/0088805 A1* | 4/2005 | Edson et al. | 361/529 |
| 2005/0152099 A1* | 7/2005 | Fujii et al. | 361/523 |

FOREIGN PATENT DOCUMENTS

| | | | |
|---|---|---|---|
| JP | 5-291079 A | | 11/1993 |
| JP | 9-213570 A | | 8/1997 |
| JP | 2001-44077 | * | 2/2001 |
| JP | 2001-085273 A | | 3/2001 |
| JP | 2001-143966 A | | 5/2001 |
| JP | 2001-291641 A | | 10/2001 |
| JP | 2002-151357 A | | 5/2002 |
| JP | 2002/203747 | * | 7/2002 |
| JP | 2003-100555 | * | 4/2003 |
| JP | 2003-197484 | * | 7/2003 |
| JP | 2005-197457 | * | 7/2005 |

* cited by examiner

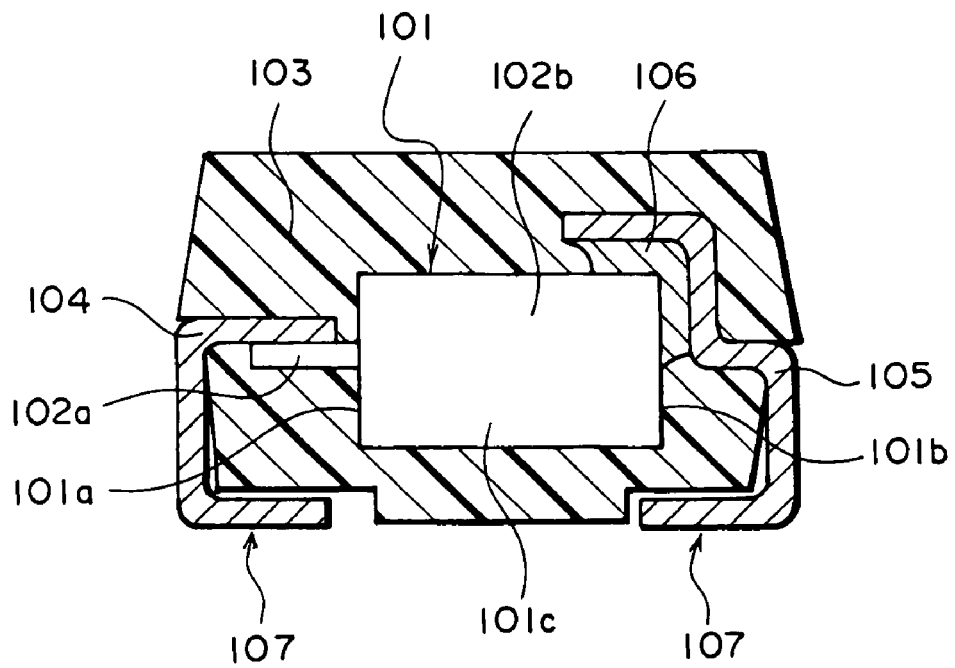
FIG. 1 EXISTING ART
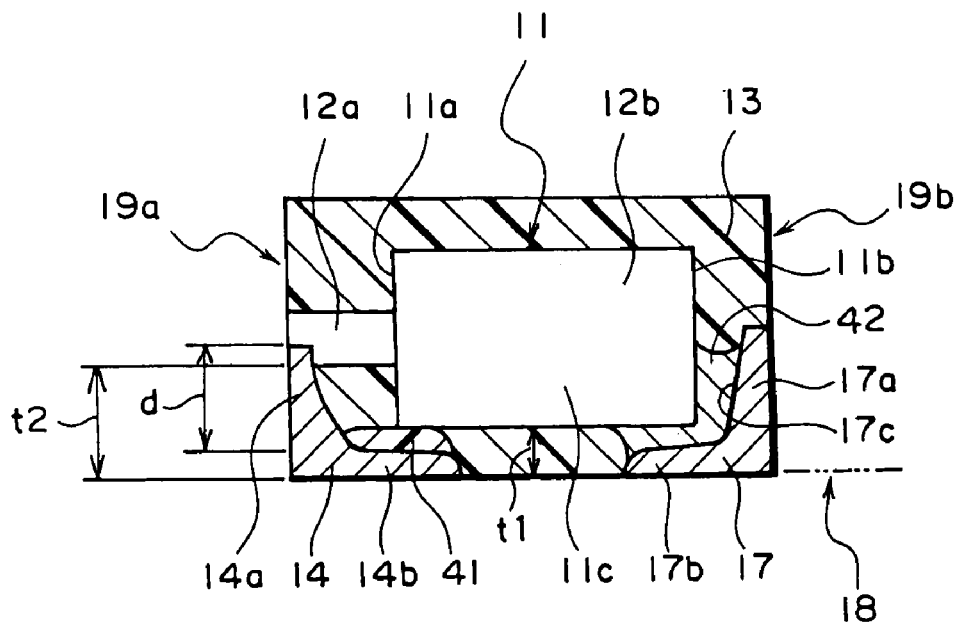
FIG. 2

CHIP TYPE SOLID ELECTROLYTIC CAPACITOR HAVING A SMALL SIZE AND A SIMPLE STRUCTURE

This application claims priority to prior Japanese application JP 2003-16177, the disclosure of which is incorporated herein by reference.

BACKGROUND OF THE INVENTION

The present invention relates to a chip type solid electrolytic capacitor and to a method of manufacturing the same.

An example of a chip type solid electrolytic capacitor comprises a capacitor element, a packaging resin covering the capacitor element, and anode and cathode terminal which are electrically connected to the capacitor element and coupled to the packaging resin. The packaging resin has a mount surface and a side surface adjacent to the mount surface. A chip type solid electrolytic capacitor of the type is disclosed in Japanese Unexamined Patent Application Publication No. 291079/1993 and will be described in detail in conjunction with the drawing.

In case where such a chip type solid electrolytic capacitor is tried to be reduced in size and in height, a volume ratio of the anode and the cathode terminals relative to the chip type solid electrolytic capacitor is increased. When the volume ratio of the anode and the cathode terminals is increased, the ratio of the volume of a portion of the capacitor element which contributes to capacitance with respect to the total volume of the capacitor, i.e., the volume efficiency is reduced. For example, when the thickness (height) of the capacitor (the package resin) is 0.8 mm, the volume efficiency of capacitor element may be as small as 20% or less.

SUMMARY OF THE INVENTION

It is therefore an object of the present invention to provide a chip type solid electrolytic capacitor having a small size and a simple structure and high in volume efficiency of a portion of the capacitor element which contributes to capacitance with respect to the total volume of the capacitor.

It is another object of the present invention to provide a method capable of easily manufacturing such a chip type solid electrolytic capacitor.

According to an aspect of the present invention, there is provided a chip type solid electrolytic capacitor comprising a capacitor element, a packaging resin covering the capacitor element and having a mount surface and a side surface adjacent to the mount surface, and a terminal electrically connected to the capacitor element and coupled to the packaging resin, the terminal extending along the mount surface and the side surface to have an outer surface exposed from the packaging resin and to have an inner surface opposite to the outer terminal surface, the inner surface having a stepwise shape formed by forging.

According to another aspect of the present invention, there is provided a chip type solid electrolytic capacitor comprising a capacitor element having an anode lead and a cathode layer, a packaging resin covering the capacitor element and having a mount surface and side surfaces adjacent to the mount surface and opposite to each other, an anode terminal electrically connected to the anode lead and coupled to the packaging resin, and a cathode terminal electrically connected to the cathode layer and coupled to the packaging resin, each of the anode terminal and the cathode terminal extending along the mount surface and each of the side surfaces to have an outer surface exposed from the packaging resin and to have an inner surface opposite to the outer surface, the inner surface having a stepwise shape formed by forging.

According to still another aspect of the present invention, there is provided a method of manufacturing a chip type solid electrolytic capacitor comprising a capacitor element having an anode lead and a cathode layer, a packaging resin covering the capacitor element and having a mount surface and side surfaces adjacent to the mount surface and opposite to each other, an anode terminal electrically connected to the anode lead and coupled to the packaging resin, and a cathode terminal electrically connected to the cathode layer and coupled to the packaging resin, the method comprising preparing a lead frame having an anode terminal-forming portion and a cathode terminal-forming portion, forging to form a stepwise shape in a part of the anode terminal-forming portion, connecting the anode lead to the anode terminal-forming portion, connecting the cathode layer to the cathode terminal-forming portion, covering the capacitor element with a packaging resin except a part of the anode terminal-forming portion and a part of the cathode terminal-forming portion, and cutting out the chip type solid electrolytic capacitor from the lead frame.

Other objects, features, and advantages of the present invention will become apparent from reading the following detailed description of this specification.

BRIEF DESCRIPTION OF THE DRAWINGS

FIG. 1 is a cross sectional view showing an example of the existing chip type solid electrolytic capacitor;

FIG. 2 is a cross sectional view showing a chip type solid electrolytic capacitor according to a preferred embodiment of the present invention;

DESCRIPTION OF THE PREFERRED EMBODIMENTS

Figure 3:
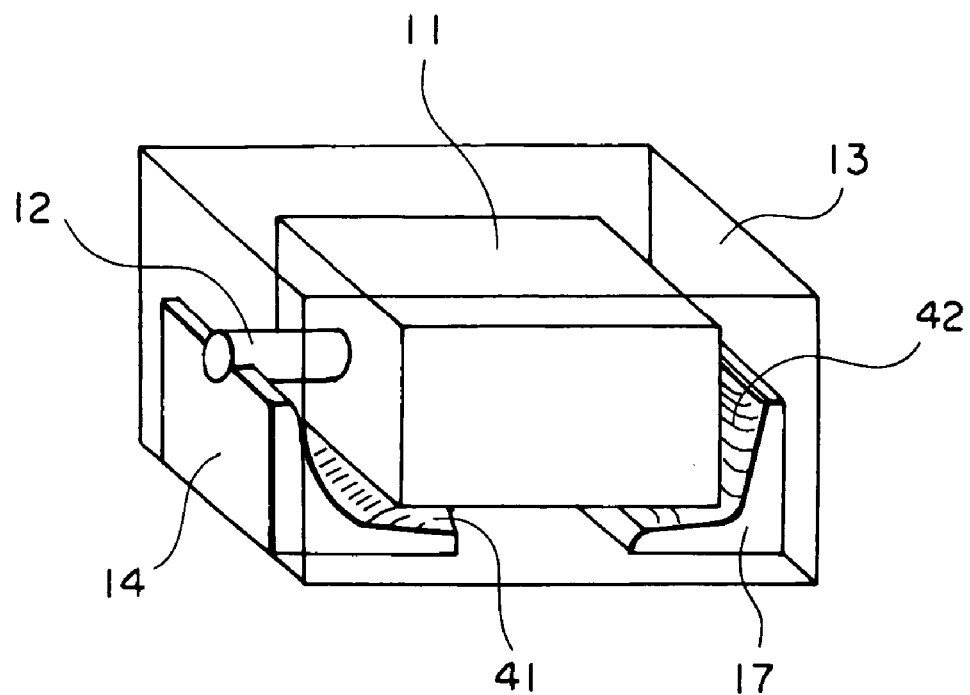
FIG. 3 is an interior perspective view showing the chip type solid electrolytic capacitor illustrated in FIG. 2.

In order to facilitate an understanding of the present invention, description will at first be made about the existing chip type solid electrolytic capacitor mentioned above.

Referring to FIG. 1, the existing chip type solid electrolytic capacitor comprises a capacitor element 101 using a valve metal, an anode terminal 104, a cathode terminal 105, and a packaging resin 103.

The capacitor element 101 has first and second element end surfaces 101a and 101b formed at one end and the other end in an axial direction and an element peripheral surface 101c formed between the first and the second element end surfaces 101a and 101b and is provided with an anode lead 102a led out from the first element end surface 101a and a cathode surface (cathode layer) 102b formed on the element peripheral surface 101c and the second element end surface 101b.

The chip type solid electrolytic capacitor is manufactured as follows. A cathode terminal 105 of a terminal frame 107 is connected to the cathode surface 102b of the capacitor element 101 preliminarily prepared by an electrical conductive adhesive. A contact region where the anode lead 102a of the capacitor element 101 and the anode terminal 104 of the terminal frame 107 are contacted with each other is welded. The capacitor element 101 and the terminal frame 107 are covered with resin by molding so that a part of the anode terminal frame 107 is exposed. The terminal frame 107 is bent along an outer surface of the packaging resin 103. Thus, the capacitor is manufactured.

The existing chip type solid electrolytic capacitor mentioned above has such disadvantage mentioned in the background of the present specification.

Now, a chip type solid electrolytic capacitor according to the present invention will be described with reference to the drawings.

Figure 4:
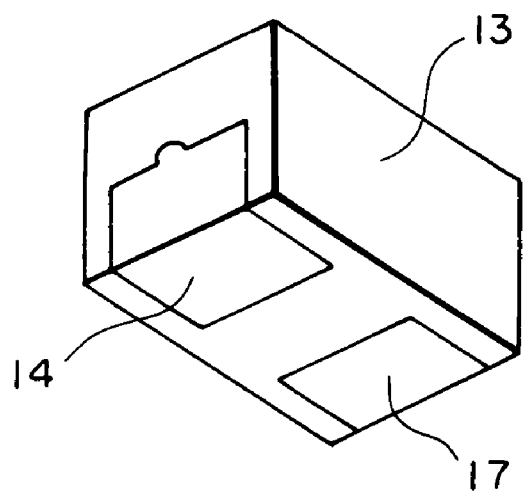
FIG. 4 is a perspective view showing the chip type solid electrolytic capacitor illustrated in FIG. 2.

Referring to FIGS. 2 to 4, a chip type solid electrolytic capacitor according to an embodiment of the present invention is adapted to be mounted on an electronic device or electronic equipment. In the manner which will later be described in detail, the chip type solid electrolytic capacitor comprises a capacitor element 11 using a valve metal, an anode terminal 14, a cathode terminal 17, and a packaging resin 13.

The capacitor element 11 has first and second element end surfaces 11a and 11b formed at one end and the other end in an axial direction and an element peripheral surface 11c formed between the first and the second element end surfaces 11a and 11b and is provided with an anode lead 12a led out from the first element end surface 11a and a cathode surface (cathode layer) 12b formed on the element peripheral surface 11c and the second element end surface 11b.

The anode terminal 14 is connected to the anode lead 12a of the capacitor element. The cathode terminal 17 is connected to the cathode surface 12b of the capacitor element.

The packaging resin 13 covers the capacitor element 11 with a part of the anode terminal 14 and a part of the cathode terminal 17 exposed. These parts are adjacent to each other. Further, the packaging resin 13 is provided with first and second package end (side) surfaces 19a and 19b and a package peripheral surface formed between the first and the second package end surface 19a and 19b. The package peripheral surface includes a mount surface 18 for mounting the capacitor to a mounting surface of an electric board (not shown).

Furthermore, the anode terminal 14 has a stepwise shape by forging (cold forging or hot forging), press-working, or sinking. The stepwise shape is constituted by a second anode terminal step 14b with a part thereof exposed from the mount surface 18 and a first anode terminal step 14a with a part thereof exposed from the first package end surface 19a.

The second anode terminal step 14b supports the cathode surface 12b of the capacitor element 11 in the packaging resin 13 with the cathode surface 12b electrically isolated from the anode terminal 14.

The first anode terminal step 14a has a thickness larger than that of the second anode terminal step 14b and supports the anode lead 12a of the capacitor element 11 in the packaging resin 13 with the anode lead 12a electrically connected to the anode terminal 14.

The cathode terminal 17 is exposed from a part of the mount surface 18 and a part of the second package end surface 19b. These parts are adjacent to each other.

The cathode terminal 17 has a stepwise shape. The stepwise shape is constructed by a second cathode terminal step 17b with a part thereof exposed from the mount surface 18 and a first cathode terminal step 17a with a part thereof exposed from the second package end surface 19b.

The second cathode terminal step 17b supports the cathode surface 12b of the capacitor element 11 in the packaging resin 13 with the cathode surface 12b electrically connected to the cathode terminal 17.

The first cathode terminal step 17a has a thickness larger than that of the second cathode terminal step 17b and is provided with a wall surface portion 17c electrically connected to the cathode surface 12b.

In the chip type solid electrolytic capacitor, the second anode terminal step 14b and the second cathode terminal step 17b are small in thickness and are therefore arranged under the capacitor element 11. Therefore, the second anode terminal step 14b and the second cathode terminal step 17b can be mounted on the electric board in a space-saving manner.

Furthermore, an anode side region of the capacitor element 11 are fixed and supported not only by the anode lead 12a supported and fixed by the first anode terminal step 14a of the anode terminal 14 but also by the anode side region of the cathode surface 12b supported by the second anode terminal step 14b. Therefore, as compared with the existing capacitor in which the anode side region of the capacitor element is supported by the anode lead alone, the chip type solid electrolytic capacitor is excellent in strength. Particularly, because a fillet is formed between the second anode terminal step 14b and the anode side region, the capacitor element 11 is fixed and supported with high strength.

This structure will hereinafter be described in detail. Referring to FIG. 2, the mount surface 18 and a mount surface on the second anode terminal step 14b in the cathode surface 12b are spaced at a distance t1 from each other. The mount surface 18 and a peripheral surface of the anode lead 12a are spaced at a minimum distance t2 from each other. The second anode terminal step 14b of the anode terminal 14 has a thickness smaller than the distance t1. The first anode terminal step 14a of the anode terminal 14 has a thickness greater than the distance t2. Further, a step difference d is larger than a difference (t2−t1). The difference (t2−t1) is a minimum distance between the mount surface on the second anode terminal step 14b of the anode terminal 14 in the cathode surface 12b and the peripheral surface of the anode lead 12a.

Now, a method of manufacturing the chip type solid electrolytic capacitor according to the embodiment of the present invention will be described.

First, the capacitor element 11 is manufactured.

In this invention, the method generally comprises the steps of connecting the anode lead 12a to an anode terminal-forming portion of a lead frame for forming the anode terminal 14, connecting the cathode surface 12b of the capacitor element 11 to a cathode terminal-forming portion of the lead frame for forming the cathode terminal 17, covering the capacitor element 11 except a part of the anode terminal-forming portion and a part of the cathode terminal-forming portion with the packaging resin 13, and cutting out a chip serving as the chip type solid electrolytic capacitor from the lead frame.

The anode terminal connecting step includes a step of thinning a part of the anode terminal-forming portion and forming the anode terminal into a stepwise shape by forging.

Also, the cathode terminal connecting step includes a step of thinning a part of the cathode terminal-forming portion and forming the cathode terminal into a stepwise shape, by forging.

Figure 5A:
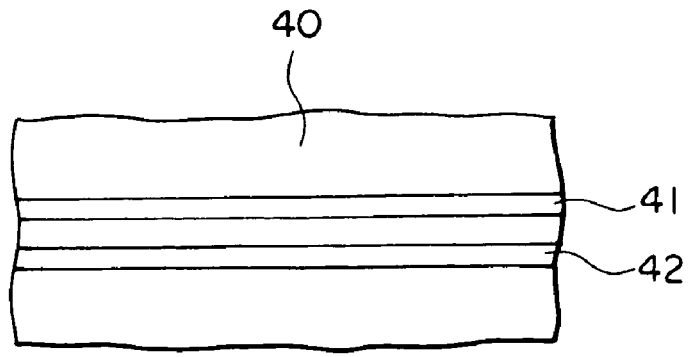
FIGS. 5A through 5D are views for describing a method of manufacturing the chip type solid electrolytic capacitor according to this invention.
Figure 5B:
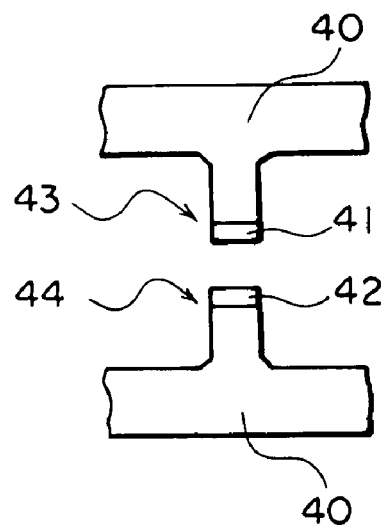
Figure 5C:
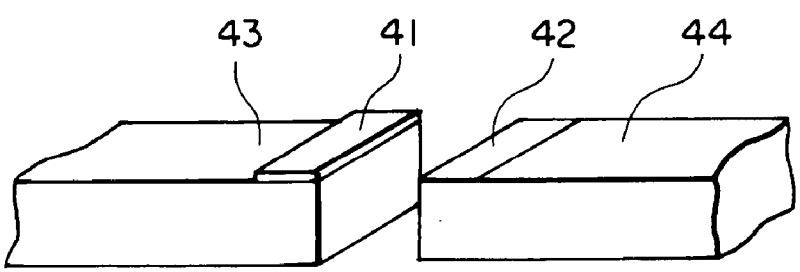

As shown in FIG. 5A, an electrical-insulation resin film 41 and an Ag (silver) plating film 42 as an electrical-conductive film are applied to the lead frame 40. The anode terminal-forming portion 43 and the cathode terminal-forming portion 44 are formed as shown in FIGS. 5B and 5C by stamping.

Figure 5D:
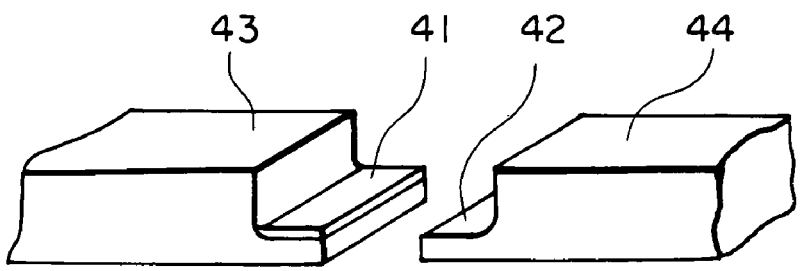

A part of the anode terminal-forming portion 43 and a part of the cathode terminal-forming portion 44 are thinned or reduced in thickness to approximate ¼ as shown in FIG. 5D so that the anode terminal-forming portion 43 and the cathode terminal-forming portion 44 are respectively formed into a stepwise shape by forging.

Preferably, electrical-insulation resin for producing the electrical-insulation resin film 41 is excellent in malleability so as to withstand the forging. However, the electrical-insulation resin may be applied to the anode terminal-forming portion 43 after the forging.

Furthermore, the electrical-conductive film applied to the cathode terminal-forming portion 44 is not limited to the Ag plating film 42. For example, an Ag film formed by another general film-forming process except plating can be used. Further, a film made from one of Ag, Au (gold), Cu (copper), and Pd (palladium) can be adopted instead of the Ag film. Still Further, a film made of an alloy including at least one of Ag, Au, Cu, and Pd can be adopted.

Hereinbelow, the step of connecting the anode lead 12a to the anode terminal-forming portion 43 of the lead frame 40 will be described.

Figure 6A:
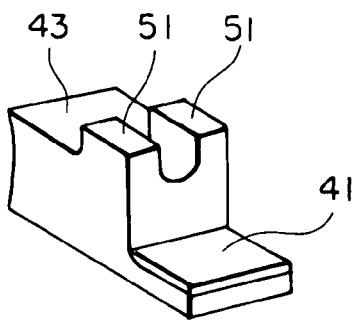
FIGS. 6A and 6B are perspective views for describing the step following the step in FIGS. 5A through 5D, according to different embodiments, respectively.
Figure 6B:
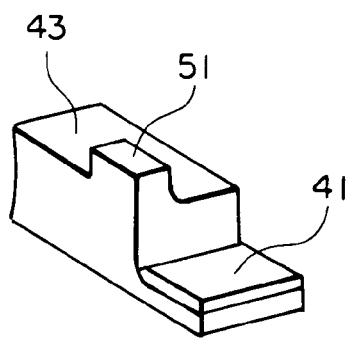

As shown in FIG. 6A, two protruding portions 51 are formed on the anode terminal-forming portion 43. However, only one protruding portion 51 may be formed on the anode terminal-forming portion 43 as shown in FIG. 6B. In either structure, the protruding portion 51 and an adjacent region become a laser welding part to the anode lead 12a.

Figure 7:
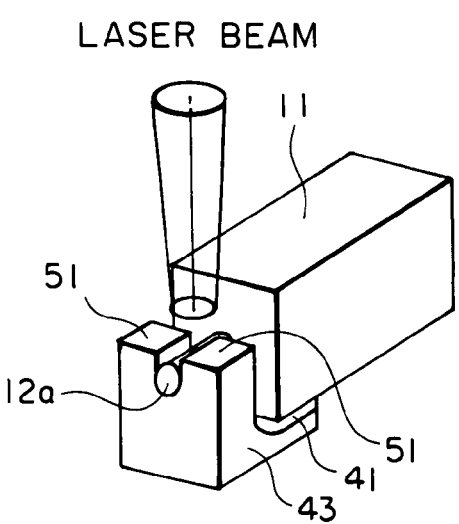
FIG. 7 is a perspective view for describing the step following the step in FIG. 6A.
Figure 8A:
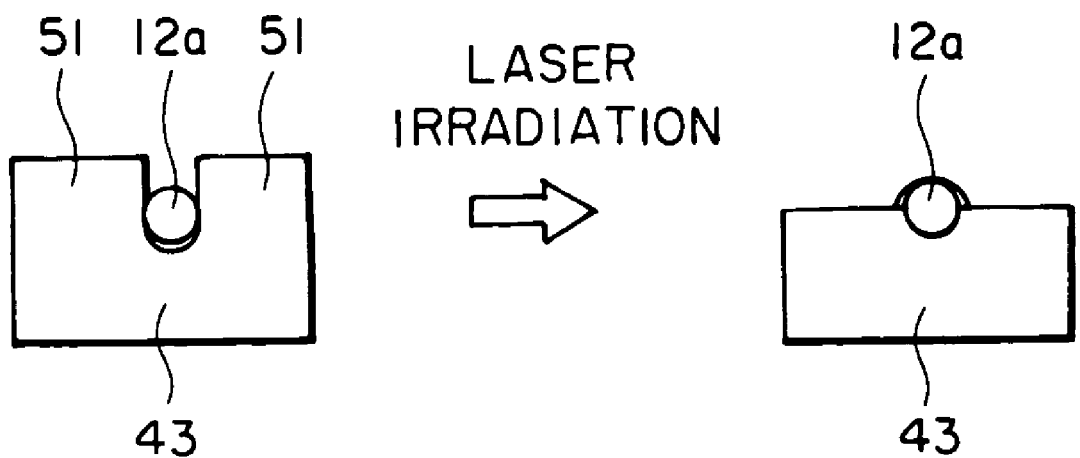
FIG. 8A is a side view of an anode terminal-forming portion illustrated in FIG. 7 and corresponding to FIG. 6A.

Next, referring to FIGS. 7 and 8A, the anode lead 12a of the capacitor element 11 is arranged between the protruding portions 51 of the anode terminal-forming portion 43. A laser beam is irradiated to an area over the protruding portions 51 and the anode lead 12a. The protruding portions 51 are melted by laser irradiation, surround the anode lead 12a, and are solidified. Thus, a rigid welded portion is formed.

Figure 8B:
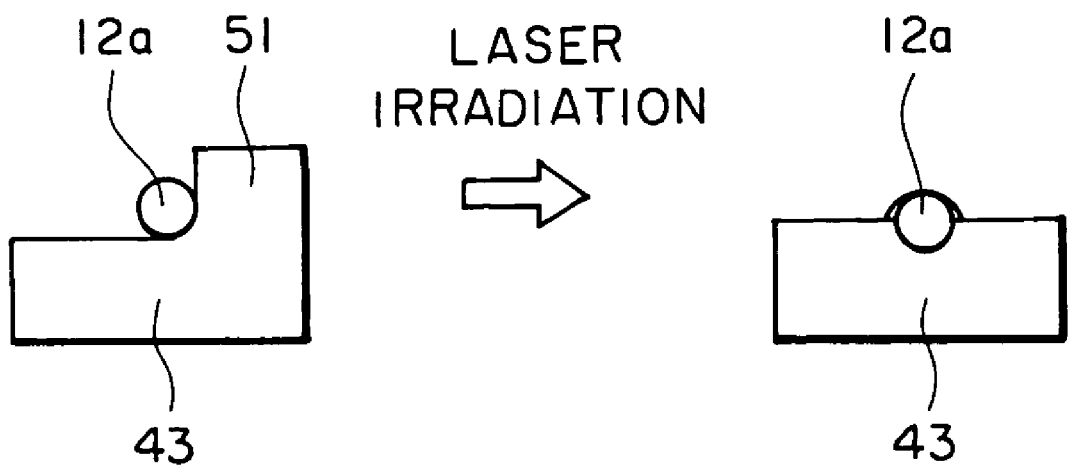
FIG. 8B is a side view similar to FIG. 8A but corresponding to FIG. 6B.

Referring to FIG. 8B, in case of one protruding portion 51, the anode lead 12a of the capacitor element 11 is arranged adjacent the side surface of the protruding portion 51 of the anode terminal-forming portion 43. A laser beam is irradiated to an area over the protruding portion 51 and the anode lead 12a. The protruding portion 51 is melted by laser irradiation, surrounds the anode lead 12a, and is solidified. Thus, a rigid welded portion is formed.

In a case where the anode lead is welded to the anode terminal-forming portion of the lead frame by resistance welding, a flat surface or a V-groove portion is formed on the anode terminal-forming portion. The anode lead is brought into contact with the flat surface or the V-groove portion. Then, the anode lead is welded to the anode terminal-forming portion by the resistance welding.

Hereinafter, the steps of covering the capacitor element 11 except a part of the anode terminal-forming portion 43 and a part of the cathode terminal-forming portion 44 with the packaging resin 13 and cutting out the chip serving as the chip type solid electrolytic capacitor from the lead frame 40 will be described.

Figure 9A:
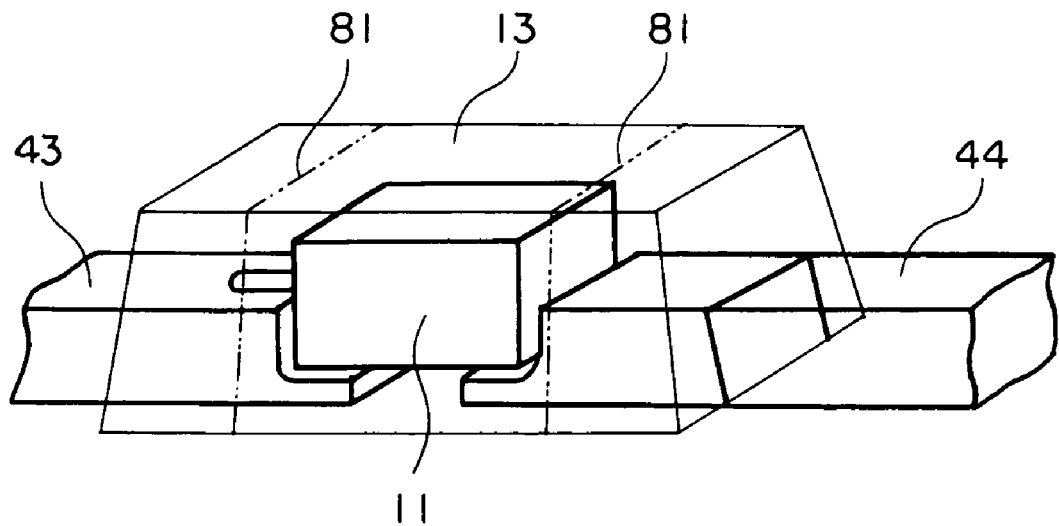
FIGS. 9A and 9B are views for describing the step following the step illustrated in FIG. 7.
Figure 9B:
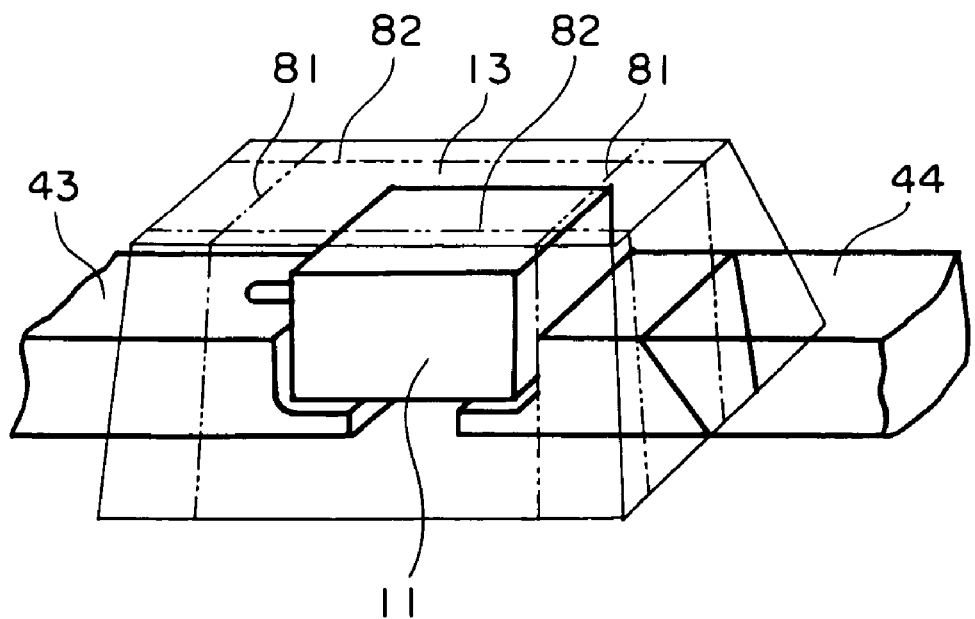

As shown in FIGS. 9A and 9B, the capacitor element 11 and the anode terminal-forming portion 43 and the cathode terminal-forming portion 44 of the lead frame are covered with the packaging resin 13 so that a part of the anode terminal-forming portion 43 and a part of the cathode terminal-forming portion 44 are exposed from the packaging resin 13. Next, the packaging resin 13 is cut along two cutting surfaces 81 as shown in FIG. 9A and thus the chip as the chip type solid electrolytic capacitor is provided. However, the packaging resin 13 can be cut along four cutting surfaces 81 and 82 as shown in FIG. 9B. When the packaging resin 13 is cut along four surfaces, the volume efficiency of the chip is higher than that of the chip cut along two cutting surfaces.

Hereinafter, description will be made of means for improving the coupling strength between the anode and the cathode terminals and the packaging resin in order to prevent the packaging resin from exfoliating from the anode and the cathode terminals because of thermal or mechanical stress generated inside or outside of the chip.

As shown in FIGS. 10A to 10D, an exposed surface of the anode terminal 14 exposed from the first package end surface of the packaging resin 13, that is, a cross sectional surface of the anode terminal 14 perpendicular to the axial direction mentioned above, has a generally rectangular shape.

Figure 10A:
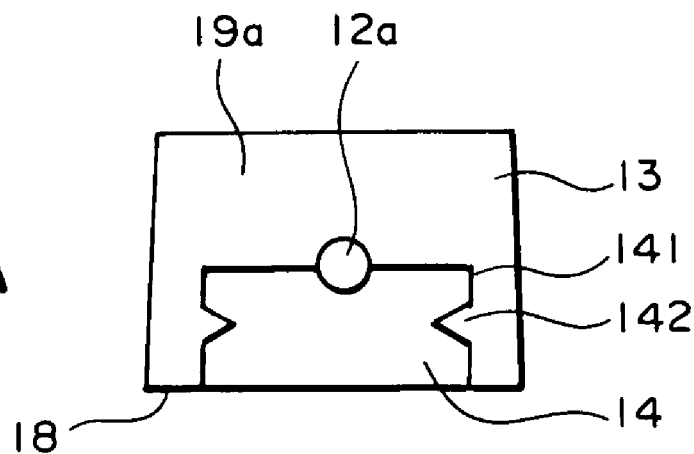
FIGS. 10A to 10D are views showing chip type solid electrolytic capacitor according to various embodiments of this invention.

FIG. 10A shows an example where the exposed surface of the anode terminal 14 has a rectangular shape with wedge-shaped concave portions 142 formed at left and right sides (edges) thereof. More particularly, the exposed surface is defined between two edges 141 substantially perpendicular to the mount surface 18 and the concave portions 142 are notches recessed from the edges, respectively.

Figure 10B:
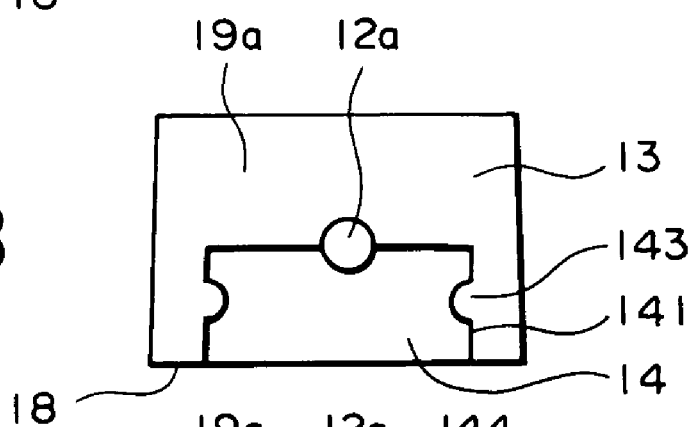

FIG. 10B shows another example where the exposed surface of the anode terminal 14 has a rectangular shape with semicircle concave notches or portions 143 formed at left and right sides (edges) thereof in place of the wedge-shaped concave portions 142. However, the shape of each concave portion is not limited to that shown in FIGS. 10A or 10B.

Figure 10C:
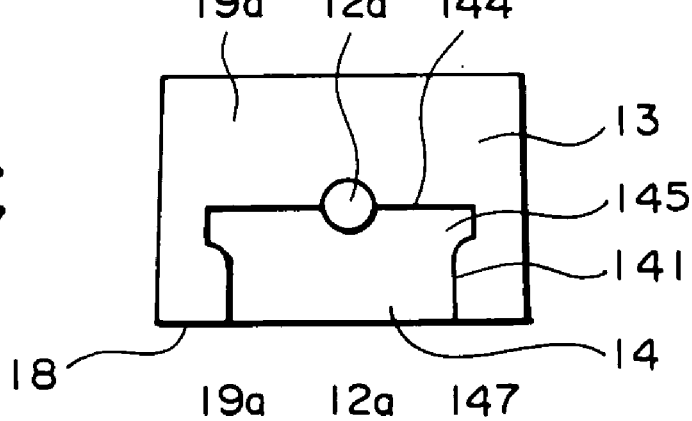

FIG. 10C shows still another example where the exposed surface of the anode terminal 14 has a rectangular shape with convex portions 145 formed at left and right sides (edges) thereof. More particularly, the exposed surface is defined between the mount surface 18 and an edge 144 opposite to the mount surface 18 and the convex portions 145 are formed in the vicinity of the edge 144. However, the shape of each convex portion is not limited to that shown in FIG. 10C.

Figure 10D:
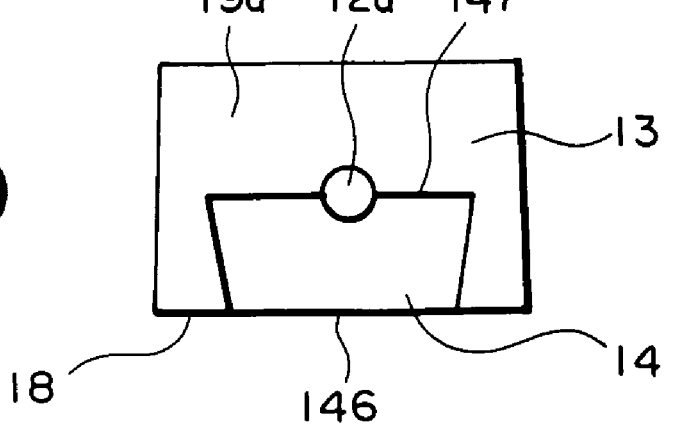

FIG. 10D shows another example where the exposed surface of the anode terminal 14 has a trapezoidal shape, specifically, an upside-down trapezoidal shape having a lower side (edge) located at the mount surface 18 of the chip and an upper side (edge) longer than the lower side. In other words, the exposed surface has a first edge 146 adjacent to the mount surface 18 and a second edge 147 opposite to the first edge and longer than the first edge 146.

In the chips shown in FIGS. 10A to 10D, the anode terminal 14 is not easily separated or released. In other words, the packaging resin 13 is not easily exfoliated from the anode terminal 14.

Furthermore, an exposed surface of the cathode terminal exposed from the second package end surface of the packaging resin 13, that is, a cross sectional surface of the cathode terminal 17 perpendicular to the axial direction, may also have a generally rectangular shape having a concave or a convex portion or may have an upside-down trapezoidal shape, like the anode terminal 14 shown in FIGS. 10A to 10D.

Hereinafter, more specific embodiments of the present invention will be described in detail with reference to FIGS. 2 to 10.

First Embodiment

First, a method of manufacturing the capacitor element 11 will hereinafter be described.

As a valve metal, Ta (tantalum) is used. A Ta powder is formed on a Ta wire to serve as the anode lead 12a by using a press machine. The Ta wire is sintered in a high-vacuum and high-temperature environment. In the present invention, the valve metal represents such a metal that, when oxidized, forms an oxide film, which performs a valve operation.

Subsequently, an oxidized film of $Ta_2O_5$ is formed on the Ta powder of the sintered Ta wire.

Further, after this tantalum-sintered body is immersed into a manganese nitrate liquid, $MnO_2$ is formed by pyrolysis of this immersed body.

Subsequently, the cathode surface 12b of graphite and Ag is formed on this body.

Thus, the capacitor element 11 is produced.

Next referring to FIGS. 5A to 5D, formation of the lead frame 40 will be described.

As shown in FIG. 5A, the electrical-insulation resin film 41 and the Ag plating film 42 are formed on the lead frame 40. Subsequently, the anode terminal-forming portion 43 and the cathode terminal-forming portion 44 are formed as shown in FIGS. 5B and 5C by stamping the lead frame 40.

A part of the anode terminal-forming portion 43 and a part of the cathode terminal-forming portion 44 are thinned or reduced in thickness to approximate ¼ as shown in FIG. 5D so that the anode terminal-forming portion 43 and the cathode terminal-forming portion 44 are respectively formed into a stepwise shape by forging.

When the anode terminal-forming portion 43 and the cathode terminal-forming portion 44 are formed into a stepwise shape, the protruding portions 51 are also formed as shown in FIG. 6A. The protruding portion 51 and the adjacent region become a laser welding part to the anode lead 12a.

Next, the capacitor element 11 is fixed to the lead frame 40.

Namely, after a conductive adhesive including Ag is applied to the Ag plating film 42 formed on the cathode terminal forming-portion 44 of the lead frame 40, the capacitor element 11 is arranged on the lead frame 40.

Further, as shown in FIG. 7, the capacitor element 11 is welded to the anode terminal forming-portion 43 by laser welding. In FIG. 7, the lead frame 40 is omitted in illustration except the anode terminal-forming portion 43. The anode lead 12a is positioned by the protruding portions 51 before the laser beam irradiation and is covered with the melted protruding portions 51 after the laser beam irradiation.

The lead frame 40 manufactured so far as shown in FIG. 9A is molded by the packaging resin 13 except a part of the anode terminal-forming portion 43 and a part of the cathode terminal-forming portion 44.

Subsequently, the packaging resin 13 is cut along the cutting surfaces 81 as shown in FIG. 9A and thus the chip type solid electrolytic capacitor is provided.

Second Embodiment

In a second embodiment of the present invention, a protruding portion 51 is formed on the anode terminal forming-portion 43 as shown in FIG. 6B. The anode lead 12a is contacted with a side surface of the protruding portion 51. The anode lead 12a and the protruding portion 51 are irradiated by a laser beam. The protruding portion 51 is melted and reacts with a peripheral surface of the anode lead 12a. Thus, the welded portion is formed.

Other manufacturing steps in the second embodiment are same as those of the first embodiment. In the second embodiment, the metal-forming for the anode terminal forming-portion is rather easier than the first embodiment.

Third Embodiment

Referring to FIG. 10A, in a third embodiment of the present invention, the wedge-shaped concave portions 142 are provided at the left and the right sides 141 of the exposed surface of the anode terminal forming-portion 43 (the cathode terminal forming-portion 44) exposed from the first packaging end surface 19a (the second packaging end surface 19b). In this structure, the packaging resin 13 goes into the wedge-shaped concave portions 142 so that the adhesive strength of the packaging resin 13 to the anode terminal forming-portion 43 (the cathode terminal forming-portion 44) is improved.

The wedge-shaped concave portions 142 are formed at the same step as the thinning of the anode terminal forming-portion 43 (the cathode terminal forming-portion 44) or the forming of the protruding portion 51.

Other manufacturing steps in the third embodiment are same as those of the first or the second embodiment.

Fourth Embodiment

Referring to FIG. 10B, in a fourth embodiment of the present invention, the semicircle concave portions 143 are provided at the left and the right sides of the exposed surface of the anode terminal forming-portion 43 (the cathode terminal forming-portion 44) exposed from the first packaging end surface 19a (the second packaging end surface 19b). In this structure, the packaging resin 13 goes into the semicircle concave portions 143 so that the adhesive strength of the packaging resin 13 to the anode terminal forming-portion 43 (the cathode terminal forming-portion 44) is improved.

The semicircle concave portions 143 are formed at the same step as the thinning of the anode terminal forming-portion 43 (the cathode terminal forming-portion 44) or the forming of the protruding portion 51.

Other manufacturing steps in the fourth embodiment are same as those of the third embodiment.

Fifth Embodiment

Referring to FIG. 10C, in a fifth embodiment of the present invention, the convex portions 145 are provided at the left and the right sides 141 of the exposed surface of the anode terminal forming-portion 43 (the cathode terminal forming-portion 44) exposed from the first packaging end surface 19a (the second packaging end surface 19b). In this structure, the packaging resin 13 goes under the convex portions 145 so that the adhesive strength of the packaging resin 13 to the anode terminal forming-portion 43 (the cathode terminal forming-portion 44) is improved.

The convex portions 145 are formed at the same step as the thinning of the anode terminal forming-portion 43 (the cathode terminal forming-portion 44) or the forming of the protruding portion 51.

Other manufacturing steps in the fifth embodiment are also same as those of the third embodiment.

Sixth Embodiment

Referring to FIG. 10D, in a sixth embodiment of the present invention, the anode terminal forming-portion 43 (the cathode terminal forming-portion 44) exposed from the first packaging end surface 19a (the second packaging end surface 19b) is formed into the upside-down trapezoidal shape having the lower side 146 located at the mount surface 18 of the chip and the upper side 147 longer than the lower side 146. In this structure, the packaging resin 13 goes under the sides of the trapezoidal shape so that the adhesive strength of the packaging resin 13 to the anode terminal forming-portion 43 (the cathode terminal forming-portion 44) is improved.

The trapezoidal shape is formed at the same step as the manufacturing of the lead frame 40, the thinning of the anode terminal forming-portion 43 (the cathode terminal forming-portion 44), or the forming of the protruding portion 51.

Other manufacturing steps in the sixth embodiment are also same as those of the third embodiment.

Seventh Embodiment

In a seventh embodiment, the anode lead is welded to the anode terminal forming-portion (the cathode terminal forming-portion) by the resistance welding. In this case, the flat surface of the lead frame can be directly used as the flat surface on the anode terminal forming-portion (the cathode terminal forming-portion) without metal-working for forming the protruding portion. However, the V-groove portion may be formed on the anode terminal forming-portion (the cathode terminal forming-portion). When the V-groove portion is formed, the positioning of the anode lead is easily performed.

Other manufacturing steps in the seventh embodiment are also same as those of the first embodiment.

In any of the chip type solid electrolytic capacitor according to the present invention manufactured so far, the efficiency of the volume of a portion of the capacitor element which contributes to the capacitance with respect to the total volume of the capacitor is improved to approximate two times of the existing chip type solid electrolytic capacitor. Furthermore, because the bending process of the terminal or the lead frame is not required, the number of process steps is advantageously reduced.

While the present invention has thus far been described in conjunction with several embodiments thereof, it will readily be possible for those skilled in the art to put the present invention into practice in various other manners.

What is claimed is:
1. A chip type solid electrolytic capacitor comprising:
a capacitor element including an anode lead and a cathode layer;
a packaging resin covering said capacitor element and having a mount surface, and side surfaces that are adjacent to said mount surface and opposite to each other;
an anode terminal electrically connected to said anode lead and coupled to said packaging resin; and
a cathode terminal electrically connected to said cathode layer and coupled to said packaging resin;
wherein each of said anode terminal and said cathode terminal extends along said mount surface and along a respective one of said side surfaces to have an outer surface exposed from said packaging resin and to have an inner surface opposite to said outer surface;
wherein each of said anode terminal and said cathode terminal has a stepwise shape including an upper step portion at the respective one of the side surfaces and a lower step portion apart from said side surface, wherein said upper step portion has a larger height measured in a height direction from the mounting surface than the lower step portion; and
wherein the anode lead is supported by the upper step portion of the anode terminal and the capacitor element is supported at least by the lower step portion of the cathode terminal.

2. The chip type solid electrolytic capacitor according to claim 1, wherein said capacitor element has a peripheral surface, said anode lead and said peripheral surface have a first distance therebetween in said height direction, and a difference in height between said upper step portion and said lower step portion of said anode terminal is a second distance that is greater than said first distance.

3. The chip type solid electrolytic capacitor according to claim 1, further comprising a film formed on at least a part of the cathode terminal, wherein said film includes at least one of Ag, Au, Cu, and Pd.

4. The chip type solid electrolytic capacitor according to claim 1, wherein said cathode layer is connected to said cathode terminal by a conductive adhesive including Ag.

5. The chip type solid electrolytic capacitor according to claim 1, wherein the outer surface of at least one of said anode terminal and said cathode terminal is exposed at a corresponding one of said side surfaces and has an exposed shape defined by two edges that are substantially perpendicular to said mount surface, and wherein said exposed shape includes concave portions which are recessed from respective ones of said edges.

6. The chip type solid electrolytic capacitor according to claim 5, wherein each of said concave portions comprises a wedge-shaped notch.

7. The chip type solid electrolytic capacitor according to claim 5, wherein each of said concave portions comprises a semicircle notch.

8. The chip type solid electrolytic capacitor according to claim 1, wherein the outer surface of at least one of the anode terminal and said cathode terminal is exposed at a corresponding one of said side surfaces and has an exposed shape defined by said mount surface and an edge opposite to said mount surface, and wherein said exposed shape includes convex portions in a vicinity of said edge.

9. The chip type solid electrolytic capacitor according to claim 1, wherein the outer surface of at least one of said anode terminal and said cathode terminal is exposed at a corresponding one of said side surfaces and has an exposed shape that is substantially trapezoidal and has a first edge adjacent to said mount surface and a second edge which is opposite to said first edge and longer than said first edge.

* * * * *